United States Patent
Pelley et al.

(10) Patent No.: US 8,345,469 B2
(45) Date of Patent: Jan. 1, 2013

(54) STATIC RANDOM ACCESS MEMORY (SRAM) HAVING BIT CELLS ACCESSIBLE BY SEPARATE READ AND WRITE PATHS

(75) Inventors: Perry H. Pelley, Austin, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 223 days.

(21) Appl. No.: 12/883,275

(22) Filed: Sep. 16, 2010

(65) Prior Publication Data
US 2012/0069636 A1 Mar. 22, 2012

(51) Int. Cl.
G11C 11/00 (2006.01)
G11C 7/00 (2006.01)
(52) U.S. Cl. ............ 365/154; 365/203; 365/210.1; 365/226
(58) Field of Classification Search ............ 365/154, 365/203, 210.1, 226
See application file for complete search history.

(56) References Cited

U.S. PATENT DOCUMENTS

| 5,532,955 | A | 7/1996 | Gillingham | |
|---|---|---|---|---|
| 7,292,495 | B1 | 11/2007 | Kenkare et al. | |
| 7,483,332 | B2* | 1/2009 | Houston | 365/230.05 |
| 7,660,149 | B2* | 2/2010 | Liaw | 365/154 |
| 7,706,174 | B2 | 4/2010 | Pradhan et al. | |
| 7,839,697 | B2* | 11/2010 | Ishikura et al. | 365/189.04 |
| 2011/0261609 | A1* | 10/2011 | Seshadri | 365/154 |

OTHER PUBLICATIONS

Badrudduza et al.; "Six and Seven Transistor Leakage Suppressed SRAM Cells with Improved Read Stability"; IEEE 2007 Custom Integrated Circuits Conference; 2007; pp. 225-228; IEEE.
Nakase et al.; "A High Speed Wide Band SRAM Macro using Complementary Half-Swing Bus Architecture"; Solid-State Circuits Conference; 1996; pp. 384-387; IEEE.
Suzuki et al.; "A Stable SRAM Cell Design Against Simultaneously R/W Disturbed Accesses"; 2006 Symposium on VLSI Circuits Digest of Technical Papers; 2006; 2 pgs; IEEE.

* cited by examiner

*Primary Examiner* — VanThu Nguyen
*Assistant Examiner* — Hai Pham
(74) *Attorney, Agent, or Firm* — Joanna G. Chiu; James L. Clingan, Jr.

(57) ABSTRACT

A method is for reading a first bit cell of a static random access memory in which the static random access memory has a first plurality of bit cells including the first bit cell. Each bit cell of the first plurality of bit cells includes a cross coupled pair of inverters for storing a logic state, optimized for being written, and powered by a read voltage during a read of the first plurality of bit cells. Each bit cell of the first plurality of bit cells is coupled to a true read bit line and a true write bit line, and a second plurality of bit cells is coupled to a complementary read bit line and a complementary write bit line. The true and complementary read bit lines are precharged to a precharge voltage of about half the read voltage. The true read bit line is predisposed to a logic low condition. One of a group consisting of a high impedance from the first bit cell to indicate that the logic state is a logic low and a signal voltage greater than the intermediate voltage to indicate that the logic state is a logic high is output from the first bit cell to the true read bit line.

10 Claims, 5 Drawing Sheets

STATIC RANDOM ACCESS MEMORY (SRAM) HAVING BIT CELLS ACCESSIBLE BY SEPARATE READ AND WRITE PATHS

BACKGROUND

1. Field

This disclosure relates generally to a static random access memory (SRAM), and more specifically, to an SRAM having bit cells which are accessible by separate read and write paths.

2. Related Art

As technologies continue to scale, the supply voltage of the SRAM also scales. However, the threshold voltages of the transistors are not being scaled accordingly. Therefore, as the supply voltages are continuously be lowered, the static noise margin is also being reduced, resulting in reduced SRAM efficiency, such as with respect to reading and writing of the bit cells of the SRAM. Therefore, a need exists for an improved SRAM, such as with increased margins for reads and for writes.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As technology scales, the supply voltages of SRAMs are being reduced. Therefore, in one embodiment, in order to increase the static noise margin of the bit cell, a separate read and write path is provided for each bit cell. In this manner, transistors used in writing a bit cell can be optimized for a write while transistors used in reading a bit cell can be optimized for a read. Furthermore, by using a separate read path, the bit lines used for a read can be precharged to an intermediate value that is less than the supply voltage, thus allowing for a reduced power read as compared to currently used techniques.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name, a "b" or "B" following the signal name, or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
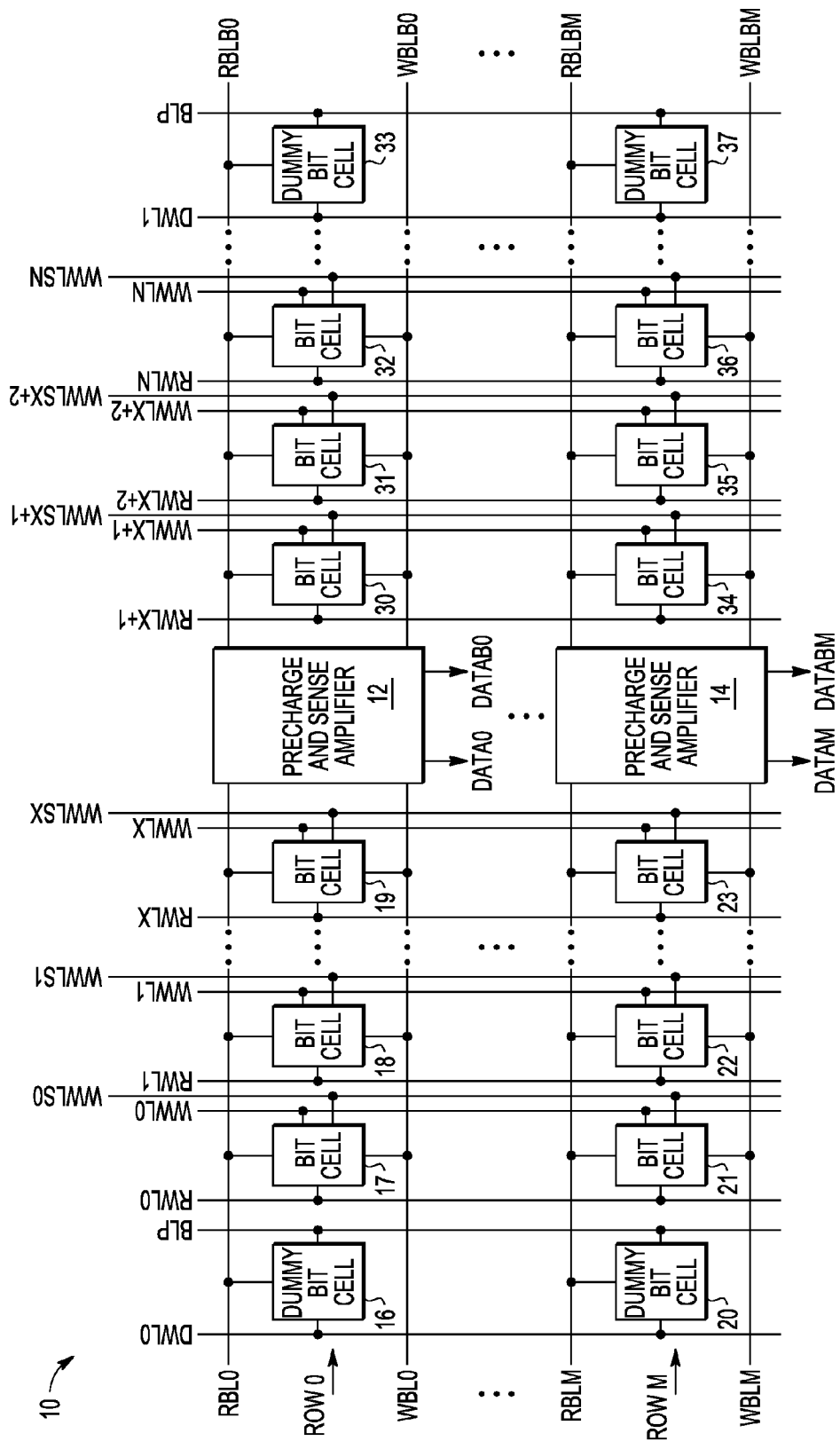
FIG. 1 illustrates, in block diagram form, an SRAM array in accordance with an embodiment.

FIG. 1 illustrates an SRAM array 10 having a plurality of data bit cells (bit cells 17-19, 21-23, 30-32, and 34-36), a plurality of dummy bit cells 16, 20, 33, and 37, a plurality of read bit lines RBL0-RBLM and RBLB0-RBLBM, a plurality of word bit lines WBL0-WBLM and WBLB0-WBLBM, a plurality of read word lines RWL0-RWLX and RWLX+1-RWLN, a plurality of write word lines WWL0-WWLX and WWLX+1-WWLN, a plurality of source control word lines WWLS0-WWLSX and WWLSX+1-WWLSN, a plurality of dummy word lines DWL0 and DWL1, a bit line precharge signal BLP, precharge and sense amplifier circuitry 12, and precharge and sense amplifier circuitry 14. Array 10 is illustrated in an unfolded configuration in which the true read bit lines (RBL0-RBLM) and true write bit lines (WBL0-WBLM) are provided to the left side of array 10 while the complementary read bit line (RBLB0-RBLBM) and the complementary write bit lines (WBLB0-WBLBM) are provided to the right side of array 10. Therefore, at any given access point in time, whether for a read or a write, only one side, the left or the right side, is being accessed. Array 10 includes M+1 rows of data. Furthermore, each row in array 10 stores bits 0 through X on the left side and bits X+1 through N on the right side. Precharge and sense amplifier circuitry 12 precharges RBL0 and RBLB0 to an intermediate value and, for a read, senses the value stored in one of bit cells 17-19, using dummy bit cell 16, or in one of bit cells 30-32, using dummy bit cell 33. Precharge and sense amplifier circuitry 12 then outputs the sensed bit value from the left side or right side of row 0 as a true data output (DATA0) and a complementary data output (DATAB0). Similarly, precharge and sense amplifier circuitry 14 precharges RBLM and RBLBM to an intermediate value and, for a read, senses the value stored in one of bit cells 21-23, using dummy bit cell 20, or in one of bit cells 34-36, using dummy bit cell 37. Precharge and sense amplifier circuitry 14 then outputs the sensed bit value from the left side or right side of row M as a true data output (DATAM) and a complementary data output (DATABM). Further details of how each bit cell is written or read will be provided below with respect to FIGS. 2-6.

Figure 2:
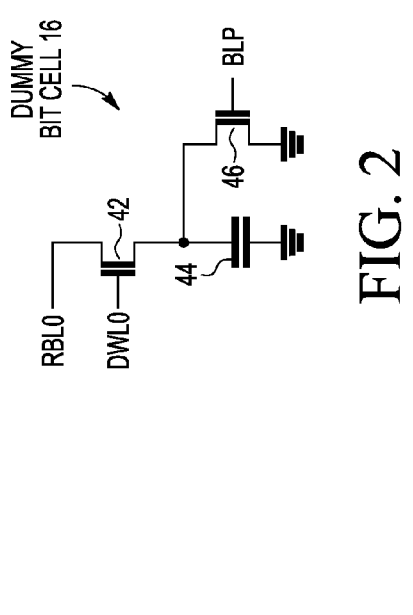
FIG. 2 illustrates, in schematic form, a dummy bit cell of the array of FIG. 1 in accordance with an embodiment.

FIG. 2 illustrates, in schematic form, dummy bit cell 16 of array 10, in accordance with one embodiment. Dummy bit cell 16 includes n-channel transistors 42 and 46, and capacitor 44. A first current electrode of transistor 42 is connected to a corresponding read bit line, RBL0, and a control electrode of transistor 42 is connected to a corresponding dummy word line, DWL0. A first terminal of capacitor 44 is connected to a second current electrode of transistor 42 and a second terminal of capacitor 44 is connected to a first power supply terminal, e.g., ground. A first current electrode of transistor 46 is connected to the second current electrode of transistor 42, a second current electrode of transistor 46 is connected to the first power supply terminal, and a control electrode of transistor 46 is connected to receive the bit line precharge signal BLP. Therefore, in operation, during the bit line precharging when BLP is asserted to a logic level one, capacitor 44 is charged to a predetermined voltage level. When not precharging, BLP is negated and transistor 46 is off. Therefore, when dummy bit cell 16 is activated during a read of row 0 (in which DWL0 is asserted, turning on transistor 42), capacitor 44 draws charge from RBL0. As will be described below, when a bit cell connected to RBL0 storing a logic level low is being read, capacitor 44 causes the voltage on RBL0 to be reduced by a predetermined amount. After a read, capacitor 44 is discharged (such as when transistors 42 and 46 are off). Note that each of the dummy bit cells of array 10, such as 20, 33, and 37, are connected in a similar manner to its corresponding word line and to its corresponding true read bit line in the case of the left side of array 10 or corresponding complementary read bit line in the case of the right side of array 10. Therefore, they also operate analogous to dummy cell 16.

Figure 3:
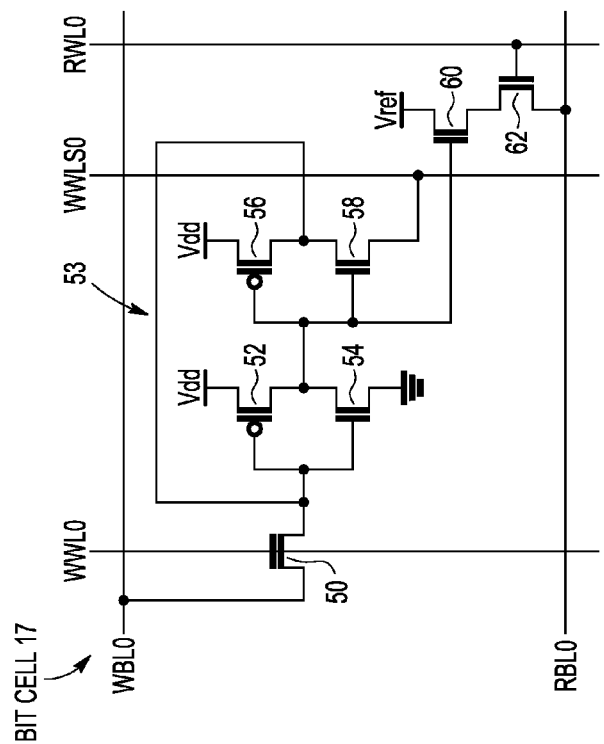
FIG. 3 illustrates, in schematic form, a bit cell of the array of FIG. 1 in accordance with an embodiment.

FIG. 3 illustrates, in schematic form, bit cell 17 of array 10 in accordance with one embodiment. Bit cell 17 includes n-channel transistors 50, 54, 58, 60, and 62 and p-channel transistors 52 and 56. A first current electrode of transistor 50 is connected to its corresponding write bit line, WBL0, a control electrode of transistor 50 is connected to its corresponding write word line, WWL0, and a second current electrode of transistor 50 is connected to a control electrode of transistor 52 and a control electrode of transistor 54. A first current electrode of transistor 52 is connected to a second power supply terminal, e.g. to receive Vdd, and a second current electrode of transistor 52 is connected to a first current electrode of transistor 54, a control electrode of transistor 56, and a control electrode of transistor 58. A second current electrode is connected to the first power supply terminal. A first current electrode of transistor 56 is connected to the second power supply terminal, a second current electrode of transistor 56 is connected to the second current electrode of transistor 50 and to a first current electrode of transistor 58. A second current electrode of transistor 58 is connected to its corresponding source control write word lines, WWLS0. The control electrode of transistor 58 is connected to a control electrode of transistor 60. A first current electrode of transistor 60 is connected to receive a reference voltage, VREF. A second current electrode of transistor 60 is connected to a first current electrode of transistor 62. A control electrode of transistor 62 is connected to its corresponding read word line, RWL0, and a second current electrode of transistor 62 is connected to its corresponding read bit line, RBL0. Note that transistors 52 and 54 form a first inverter and transistors 56 and 58 form a second inverter, and the first and second inverters form a latch 53 of bit cell 17. That is, transistors 52, 54, 56, and 58 form a pair of cross coupled inverters having a first input/output (e.g. the control electrodes of transistors 52 and 54) and a second input/output (e.g. the control electrodes of transistors 56 and 58). Note that transistor 60 may be referred to as a source follower having an input coupled to the second input/output of the pair of cross coupled inverters and an output coupled to the first current electrode of transistor 62. Alternatively, different source follower implementations may be used in place of transistor 60.

In operation, during a write, the corresponding write bit lines and write word lines and source control word lines are used to store a desired bit value into latch 53 of bit cell 17. For example, during a write to bit cell 17, WWL0 is asserted to a logic level one, thus turning on transistor 50. The desired bit value is placed on WBL0 (e.g. a logic level one or zero) which gets propagated through transistor 50 into latch 53. In one embodiment, WWLS0 is set such that the voltage on the source (e.g. second current electrode) of transistor 58 is raised in order to weaken latch 53 and allow for a more efficient write into latch 53. Once the write is complete, WWL0 is deasserted so as to decouple latch 53 from the write bit line, WBL0, and WWLS0 is deasserted.

In operation, during a read, the corresponding read word line (RWL0) and the corresponding read bit line (RBL0) are used to read the stored value. At some point, prior to performing a read, the read bit lines for both halves of array 10 (RBL0-RBLM and RBLB0-RBLBM) are precharged to a predetermined voltage value. In one embodiment, this voltage value is an intermediate voltage between Vdd and ground. For example, in one embodiment, the intermediate voltage is halfway between Vdd and ground. In one embodiment, the reference voltage is greater than the intermediate voltage and less than Vdd. For the description herein of FIG. 3, it will be assumed the read bit lines are precharged to Vdd/2. Also, as described above in reference to FIG. 2, note that capacitor 44 is also charged during the precharging of the bit lines.

During a read of bit cell 17, both bit cell 17 and dummy bit cell 16 are activated, and latch 53 is powered by Vdd (which may also be referred to as a read voltage). For example, referring to bit cell 17, RWL0 is asserted to a logic level high and bit cell 17 either provides a high impedance to RBL0 or a signal voltage to RBL0 based on the bit value stored in bit cell 17. Also, referring to dummy bit cell 16, during a read of bit cell 17, DWL0 is also asserted, thus turning on transistor 42. Therefore, if the value stored in latch 53 at the control electrodes of transistors 56 and 58 is a logic level zero (i.e. a logic low), then transistor 60 is off such that bit cell 17 provides a high impedance to RBL0. In this situation, dummy bit cell 16 causes a reduction in voltage on RBL0 from the precharged intermediate voltage (e.g. Vdd/2). Therefore, the value on RBL0 during the read of bit cell 17 when bit cell 17 stores a logic low is Vdd/2 minus some predetermined amount determined by capacitor 44. Note that dummy bit cell 16 predisposes the corresponding bit line, RBL0, to a logic low condition, but pulling the voltage on RBL0 below the precharged voltage of Vdd/2. However, if the value stored in latch 53 at the control electrodes of transistors 56 and 58 is a logic level one (i.e. a logic high), then transistor 60 is turned on, such that bit cell 17 provides a signal voltage via transistors 60 and 62 to RBL0. Therefore, the voltage on RBL0 is pulled up above Vdd/2 towards VREF to provide the signal voltage. In one embodiment, the signal voltage is less than Vdd. In one embodiment, VREF is less than Vdd but greater than Vdd/2 such that that RBL0 is pulled up to a value sufficiently above Vdd/2 to allow for correct sensing of a logic level one. Also, in this case, since latch 53 stores a logic level one, the value provided on RBL0 by dummy cell 16 is overwritten due to transistors 62 and 60 being both on. As will be described in reference to FIG. 4, the value of RBL0 can then be sensed by precharge and sense amplifier circuitry 12, in which, when RBL0 is at a predetermined amount below Vdd/2, the corresponding data output by circuitry 12 from bit cell 17 is logic level zero and when RBL0 is pulled up above Vdd/2, the corresponding data output by circuitry 12 from bit cell 17 is a logic level one.

As described above, note that only one side of array 10 is accessed for a read or a write. Therefore, when a read of bit cell 17 of row 0 is occurring, the right side of array 10 is not activated, and each of the complementary read bit lines of the right side (RBLB0-RBLBM) remain precharged to Vdd/2. For a bit cell located on the right side of array 10, WBLB0 and RBLB0 are used as the corresponding read word line and read bit line, respectively, when accessing the bit cell. Also, DWL1 is asserted to a logic level high for a read of the right side of array 10. Therefore, when, for example, bit cell 30 of row 0 on the right side of array 10 is being read, WBLB0 is asserted to a logic level high and precharge and sense amplifier 12 senses the value on RBLB0, in which each of the true read bit lines of the left side (RBL0-RBLM) remain precharged to Vdd/2.

Based on the value stored in bit cell 30, RBLB0 either remains at Vdd/2 minus a predetermined amount (which is provided as a result of the activation of dummy cell 33) or is pulled up above Vdd/2 by a predetermined amount (by coupling RBLB0 to VREF). Therefore, note that each bit cell in array 10 is connected to its corresponding word line and to its corresponding true read bit line in the case of the left side of array 10 or corresponding complementary read bit line in the case of the right side of array 10. Each bit cell's connectivity and operation is thus analogous to the descriptions of bit cell 17.

Figure 4:
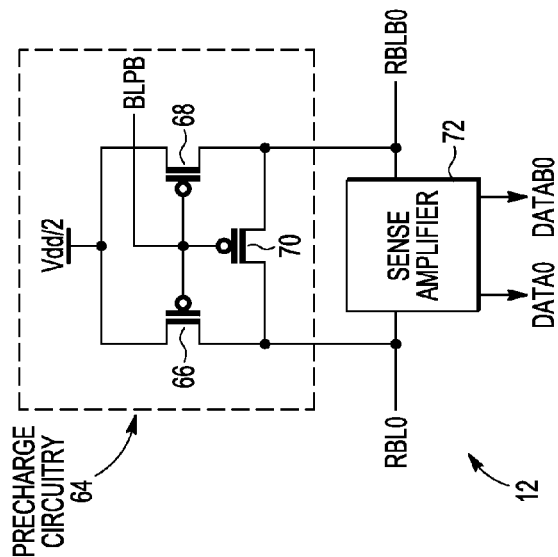
FIG. 4 illustrates, in partial schematic and partial block diagram form, precharge and sense amplifier circuitry of the array of FIG. 1, in accordance with an embodiment.

FIG. 4 illustrates, in partial schematic and partial block diagram form, precharge and sense amplifier circuitry 12 which includes precharge circuitry 64 and a sense amplifier 72. Precharge circuitry 64 includes three p-channel transistors 66, 68, and 70. A first current electrode of transistor 66 and a first current electrode of transistor 68 is connected to Vdd/2 which, in the illustrated embodiment, is the level to which to precharge the read bit lines (RBL0-RBLM and RBLB0-RBLBM). A second current electrode of transistor 66 is connected to a first current electrode of transistor 70 and RBL0. A second current electrode of transistor 68 is connected to a second current electrode of transistor 70 and to RBLB0. A control electrode of each of transistors 66, 68, and 70 are connected to receive the bit line precharge bar signal, BLPB, which is an active low signal. Therefore, during precharge, BLPB goes to a logic level low, thus turning on transistors 66, 68, and 70, which couples RBL0 and RBLB0 to Vdd/2 for a predetermined amount of time determined by the duration of BLPB being low. In this manner, each of RBL0 and RBLB0 are precharged to Vdd/2. As described above, note that the read bit lines may instead be precharged to a different intermediate voltage level other than Vdd/2. Also, note that precharge circuitry, such as precharge circuitry 64, can be used to precharge each of RBL0-RBLM and RBLB0-RBLBM.

Sense amplifier 72 is coupled to RBL0 and RBLB0, and compares RBL0 to RBLB0 to sense a bit value on RBL0 or RBLB0 by amplifying the difference in voltages present on RBL0 and RBLB0. For example, if bit cell 17 is being read, RBLB0 on the right side of array 10 remains at the precharge level of Vdd/2, and RBL0 (which is at a level either above or below Vdd/2, based on the value stored in latch 53) is compared to Vdd/2. Based on this comparison, sense amplifier 72 outputs DATA0 corresponding to the bit value stored in latch 53. In one embodiment, sense amplifier outputs a differential signal such that both DATA0 and DATAB0 are output corresponding to the value stored in latch 53. Any sense amplifier or latching sense amplifier may be used to implement sense amplifier 72.

Therefore, as can be seen in reference to FIG. 3, note that the write path for writing a value into latch 53 is provided by transistor 50 and occurs under the control of the write word line and write bit line. In this manner, operation of a write to latch 53 can be optimized without affecting operation of a read. The read path for reading a value stored in latch 53 is provided by transistors 60 and 62 and occurs under the control of the read word line and read bit line. Therefore, the read operation can be optimized without affecting operation of a write. Furthermore, power during a read may be reduced by only separating RBL and RBLB by a small amount as compared to setting one of RBL and RBLB to zero and the other to Vdd. This small amount of separation can then be amplified by a sense amplifier to properly output the read value. Also, note that only a single bit line (RBL or RBLB) is used to read a bit cell.

Figure 5:
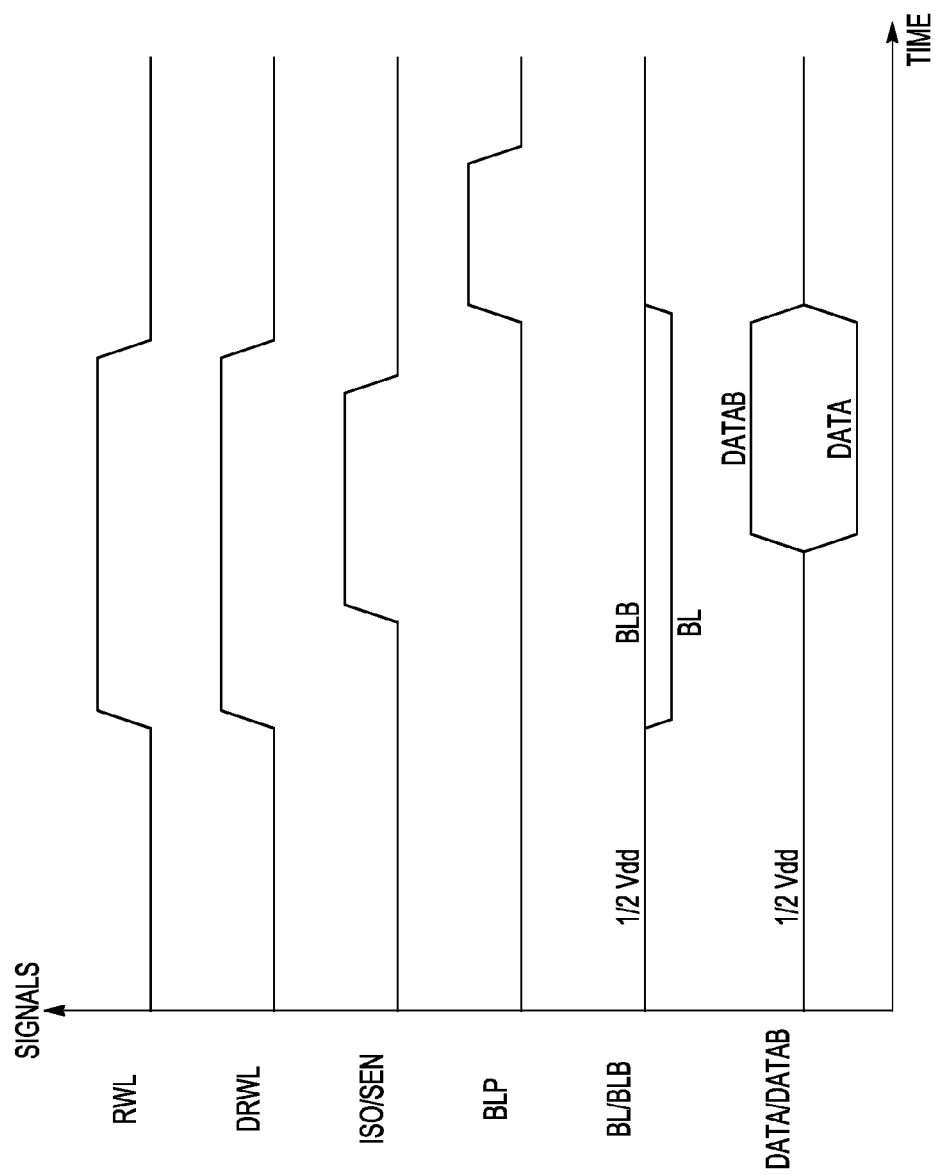
FIGS. 5 and 6 illustrate waveforms corresponding to exemplary methods of operating the array of FIG. 1.

FIG. 5 illustrates example waveforms for accessing a bit cell when the bit cell is storing a logic level zero. The waveforms of FIG. 5 can apply to any of the bit cells of the left side of array 10, in which BL are the true read bit lines on the left side and BLB are the complementary read bit lines on the right side. Note that each of BL and BLB have been previously precharged to Vdd/2. When a read is performed, both RWL (of the bit cell to be read) and DRWL (of the corresponding dummy bit cell of the bit cell to be read, which is located on the same row and side of array 10) are asserted to a logic level one. At this point, since a logic level zero is stored in the bit cell, BLB remains at its precharged level of Vdd/2 and BL is pulled down to a predetermined amount below Vdd/2 by the corresponding activated dummy bit cell. However, note that, in the illustrated embodiment, BL is not pulled down fully to zero but is only pulled down by a small amount determined, for example, by the capacitor within the dummy bit cell. At some point after RWL and DRWL are asserted, the read bit lines (BL and BLB) are isolated from the sense amplifier, and the sense amplifier is allowed to amplify and sense the values on BL and BLB. For example, this is represented in FIG. 5 by the assertion of ISO/SEN which allows for the isolation of BL and BLB from the sense amplifier and for the sensing of the values. Within the sense amplifier, the values at the input nodes of the sense amplifier are amplified (e.g. pulled apart) as indicated by the DATA/DATAB. Since a value of zero is stored in the bit cell being sensed, the value of DATAB is greater than DATA (where DATAB is a logic high and DATA is a logic low), thus indicating a logic level zero at the output of the sense amplifier. Due to the precharge voltage of Vdd/2, each of DATAB and DATA only had to be amplified (i.e. pulled up or down) by an amount of about Vdd/2, and neither had to be pulled up fully from zero or pulled down fully from Vdd.

Figure 6:
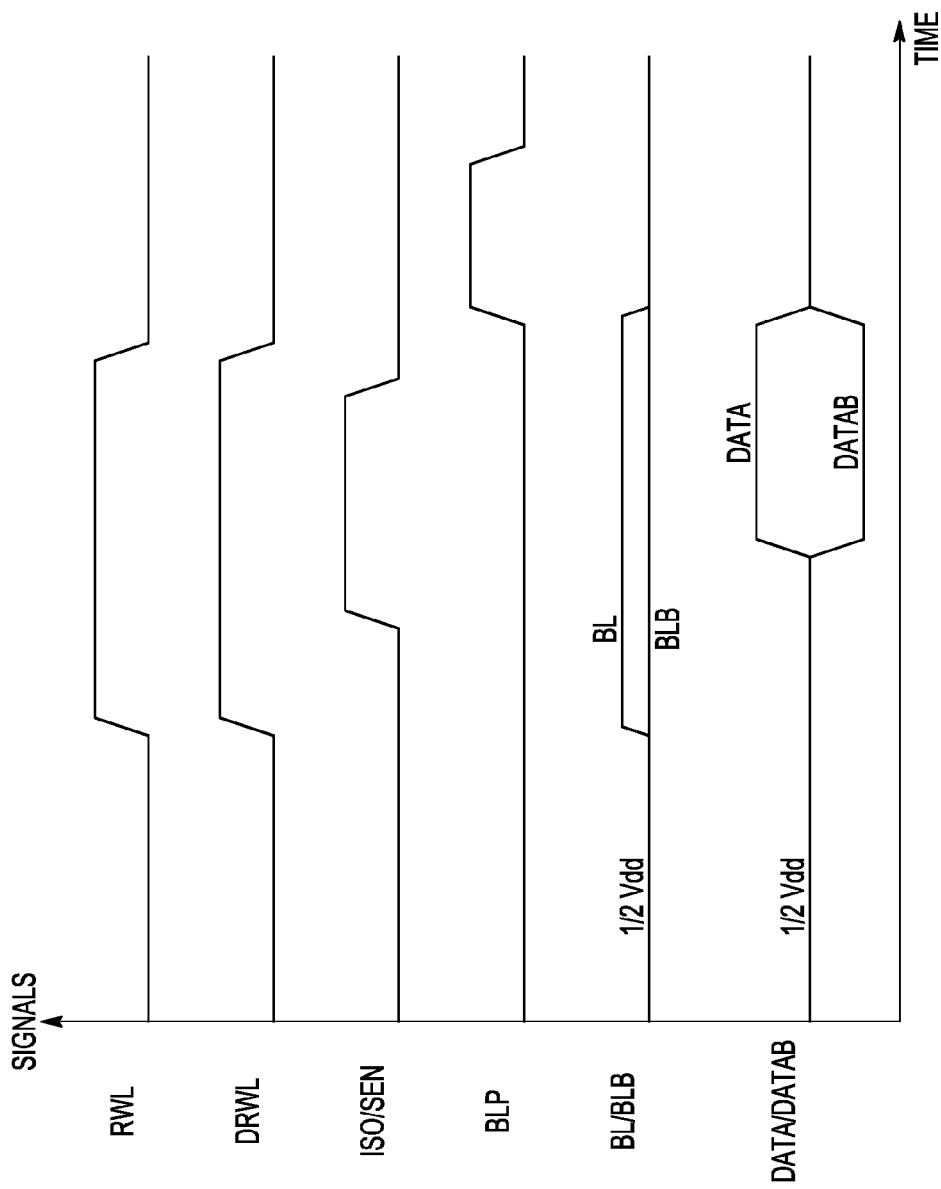

FIG. 6 illustrates example waveforms for accessing a bit cell when the bit cell is storing a logic level one. The waveforms of FIG. 6 can apply to any of the bit cells of the left side of array 10, in which BL are the true read bit lines on the left side and BLB are the complementary read bit lines on the right side. Note that each of BL and BLB have been previously precharged to Vdd/2. When a read is performed, both RWL (of the bit cell to be read) and DRWL (of the corresponding dummy bit cell of the bit cell to be read, which is located on the same row and side of array 10) are asserted to a logic level one. At this point, since a logic level one is stored in the bit cell, BL is pulled up towards VREF to some amount above Vdd/2 (since the value provided by the corresponding activated dummy cell is overwritten by the signal voltage placed on BL by the bit cell), and BLB remains at its precharged level of Vdd/2. However, note that, in the illustrated embodiment, BL is not pulled up fully to Vdd but is only pulled up by a small amount determined, for example, by VREF and the transistors coupling BL to VREF. At some point after RWL and DRWL are asserted, the read bit lines (BL and BLB) are isolated from the sense amplifier, and the sense amplifier is allowed to amplify and sense the values on BL and BLB. For example, this is represented in FIG. 6 by the assertion of ISO/SEN which allows for the isolation of BL and BLB from the sense amplifier and for the sensing of the values. Within the sense amplifier, the values at the input nodes of the sense amplifier are amplified (e.g. pulled apart) as indicated by the DATA/DATAB. Since a value of one is stored in the bit cell being sensed, the value of DATA is greater than DATAB (where DATA is a logic high and DATAB is a logic low), thus indicating a logic level one at the output of the sense amplifier. Due to the precharge voltage of Vdd/2, each of DATA and DATAB only had to be pulled up or down by an amount of about Vdd/2, and neither had to be pulled up fully from zero or pulled down fully from Vdd.

Therefore, note that by separating the read and write paths, an SRAM bit cell can be individually optimized. In this manner, improved SRAM efficiency may be achieved. For example, increased stability may be achieved at higher speeds with reduced power and noise. Furthermore, by using a small read signal swing for a read (e.g. the small swing of BL and BLB from the precharge level of Vdd/2), reduced power reads may be achieved. Furthermore, the power and noise of the sense amplifier may also be reduced due to the small read signal swing being sensed.

Note that in an alternate embodiment, a traditional 6 transistor formation may be used for the write path of the bit cell. For example, referring back to FIG. 3, rather than having the second current electrode of transistor 58 be coupled to WWLS0, it can be connected to the first supply terminal. In this embodiment, a second transistor, similar to transistor 50, can have a first current electrode connected between the first and second inverters of latch 53, a second current electrode connected to a complementary write word line, WWLB0, and a control electrode also coupled to WWL0. In this embodiment, WWLS0 would not be present. Instead, WWLB0 would be present.

Figure 7:
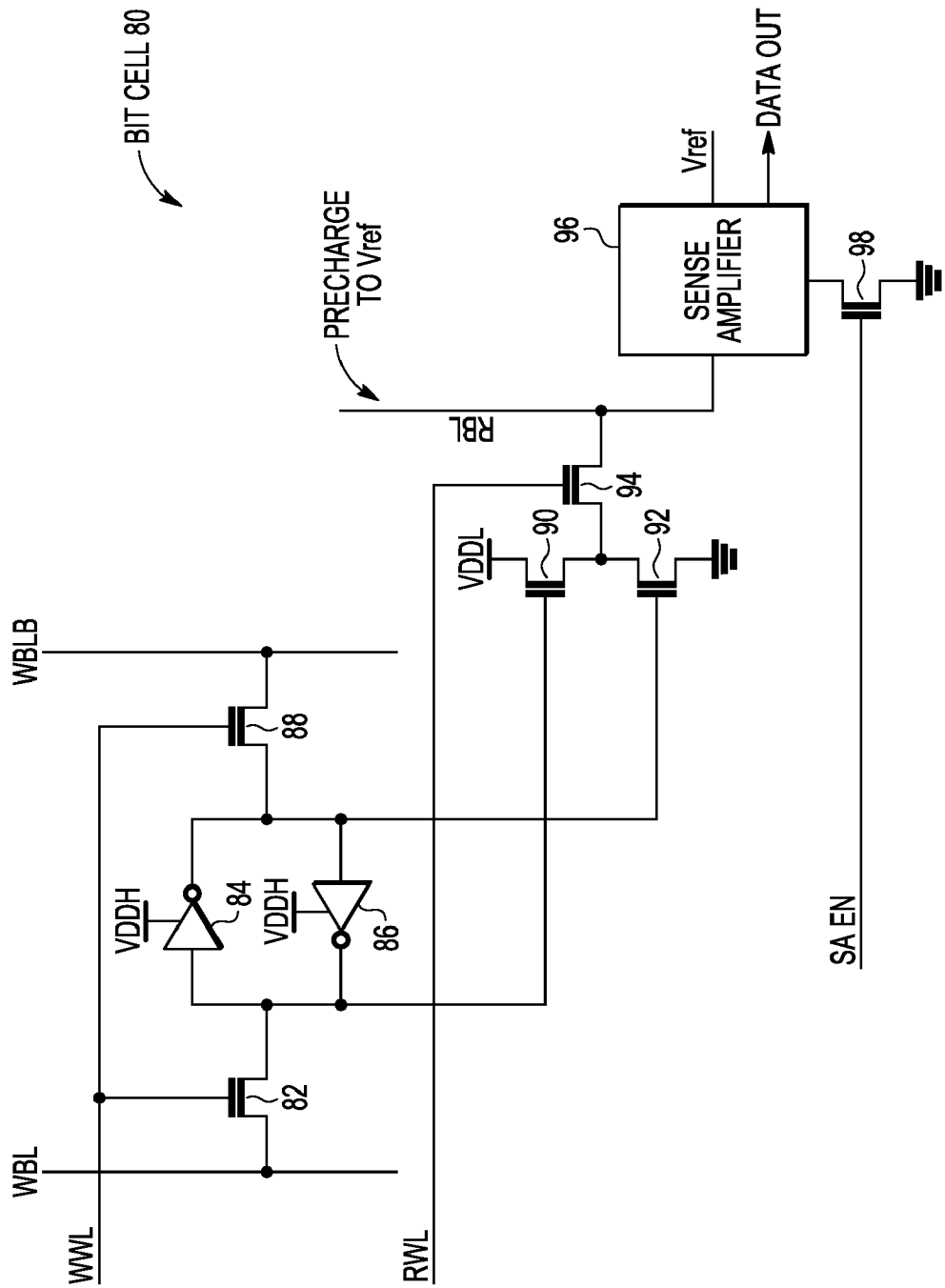
FIG. 7 illustrates, in partial schematic and partial block diagram form, a bit cell and sense amplifier of an SRAM in accordance with an embodiment.

FIG. 7 illustrates, in partial schematic and partial block diagram form, a bit cell 80 in accordance with another embodiment. Bit cell 80 includes n-channel transistors 82, 88, 90, 92, and 94, and inverters 84 and 86. Transistors 82 and 88 and inverters 84 and 86 are connected in a typical 6 transistor configuration of an SRAM bit cell. Each of inverters 84 and 86 are powered by VDDH. However, as with bit cell 17, the read and write paths are separate. Therefore, transistor 82 is connected to a write bit line (WBL) and write word line (WWL) and transistor 88 is connected to WWL and a write bit line bar (WBLB). Transistors 90, 92, and 94 provide a separate read path in which the output of inverter 86 is connected to a control electrode of transistor 90 and the output of inverter 84 is connected to a control electrode of transistor 92. A first current electrode of transistor 90 is connected to a supply voltage terminal to receive VDDL. A second current electrode of transistor 90 is connected to a first current electrode of transistor 92 and a second current electrode of transistor 92 is connected to ground. A second current electrode of transistor 92 is connected to a first current electrode of transistor 94. As control electrode of transistor 94 is connected to receive a read word line (RWL) and a second current electrode of transistor 94 is connected to the read bit line (RBL).

In operation, during a write, WWL and WBL are used to write a value to the latch formed by inverters 84 and 86 like a conventional 6 transistor bit cell. During a read, RWL and RBL are used to sense the value at the output of inverter 86. Prior to performing a read, RBL is precharged to a reference voltage, VREF. For a read, RWL is asserted to a logic level one, thus turning on transistor 94. If a zero is stored in bit cell 80 (i.e., if the output of inverter 86 is a logic level zero), transistor 90 is off and transistor 92 is on. In this case, the value on RBL is pulled down from VREF towards zero. If a one is stored in bit cell 80 (i.e., if the output of inverter 86 is a logic level one), transistor 90 is on and transistor 92 is off. In this case, the value of RBL is pulled up from VREF towards VDDL. Sense amplifier 96 can then be enabled by asserted SA_EN and turning on transistor 98. If RBL is pulled to a value above VREF, then data out from sense amplifier 96 is a logic level one, and if RBL is pulled to a value below VREF, then data out from sense amplifier 96 is a logic level zero. In the embodiment of FIG. 7, note that no dummy bit cell is needed since transistors 90 and 92 are both present. Also, in one embodiment, VREF is selected to be a value between VDDL and zero, such as, for example, VDDL/2. Therefore, note that the small swing of RBL which moves RBL either up or down from VREF may result in reduced noise and power.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also for example, in one embodiment, the illustrated elements of array 10 are circuitry located on a single integrated circuit or within a same device. Alternatively, system 10 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different precharge values may be used other than Vdd/2. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a static random access memory having bit cells connected to different paths for reading than for writing, including a first plurality of bit cells in a first row coupled to a true read bit line and a true write bit line; a first bit cell of the plurality of bit cells coupled to a first read word line and a first write word line and is selected for reading when the first read word line is enabled, wherein the first bit cell provides a high impedance to the true read bit line when the first bit cell is outputting a first logic state and provides a signal voltage on the true read bit line when the first bit cell is outputting a second logic state, wherein the first logic state is different from the second logic state; a second plurality of bit cells in a second row coupled to a complementary read bit line and a complementary write bit line, wherein the first plurality of bit cells and the second plurality of bit cells are powered by a voltage applied between a first power supply terminal at a first voltage and a second power supply terminal at a second voltage during a read; a precharge circuit that precharges, prior to a read, the true read bit line and the complementary read bit line to a precharge voltage intermediate the first voltage and the second voltage, wherein the precharge voltage is less than the signal voltage; a dummy cell coupled to the true read bit line that draws charge from the true read bit line when any one of the first plurality of bit cells is selected for reading, wherein when the first bit cell is storing the first logic state the dummy cell causes a predisposition in voltage on the true read bit line; and a sense amplifier coupled to the true read bit line and the complementary read bit line that amplifies a difference between a voltage present on the true read bit line and a voltage present on the complementary read bit line during a read. Item 2 includes the memory of item 1, wherein the first bit cell includes a pair of cross coupled inverters having a first input/output and a second input/output; a first transistor having a control electrode coupled to the first write word line, a first current electrode coupled to the true write bit line, and a second current electrode coupled to the first input/output; a source follower having an input coupled to the second input/output and an output; a second transistor having a first current electrode coupled to the output of the source follower, a control electrode coupled to the first read word line, and a second current electrode coupled to the true read bit line. Item 3 includes the memory of item 2, wherein the source follower of the first bit cell comprises a third transistor having a first current electrode coupled to a reference voltage, a gate as the input of the source follower, and a second current electrode as the output of the source follower. Item 4 includes the memory of item 3, wherein the reference voltage is greater than the intermediate voltage and less than the first voltage. Item 5 includes the memory of item 4, wherein the intermediate voltage is halfway between the first voltage and the second voltage. Item 6 includes the memory of item 5, wherein the second voltage is ground. Item 7 includes the memory of item 1, wherein the dummy cell comprises a capacitor. Item 8 includes the memory of item 7, wherein the dummy cell is further characterized by the capacitor being coupled to the true read bit line during a read of the first plurality of memory cells and being discharged after a read of the first plurality of memory cells. Item 9 includes the memory of item 8, and further includes a second dummy cell comprising a second capacitor wherein the second capacitor is coupled to the complementary read bit line during a read of the second plurality of bit cells and being discharged after the read of the second plurality of bit cells. Item 10 includes the memory of item 1, wherein the second voltage is ground and the intermediate voltage is halfway between the first voltage and ground.

Item 11 includes a method of reading first bit cell of a static random access memory having a first plurality of bit cells including the first bit cell, wherein each bit cell of the first plurality of bit cells includes a cross coupled pair of inverters for storing a logic state, optimized for being written, and powered by a read voltage during a read of the first plurality of bit cells, wherein each bit cell of the first plurality of bit cells is coupled to a true read bit line and a true write bit line; and a second plurality of bit cells coupled to a complementary read bit line and a complementary write bit line. The method includes precharging the true and complementary read bit lines to a precharge voltage of about half the read voltage; predisposing the true bit line to a logic low condition; and outputting from the first bit cell to the true read bit line one of a group consisting of a high impedance from the first bit cell to indicate that the logic state is a logic low and a signal voltage greater than the intermediate voltage to indicate that the logic state is a logic high. Item 12 includes the method of item 11, wherein the step of predisposing includes coupling a capacitor to the true read bit line. Item 13 includes the method of item 11, wherein the step of outputting is further characterized by the signal voltage being less than the read voltage. Item 14 includes the method of item 11, and further includes amplifying a difference between a voltage on the true read bit line and the complementary read bit line. Item 15 includes the method of item 11, wherein the step of sensing further includes providing an output indicating a logic low if the step of outputting is the high impedance and providing a logic high if the step of outputting is the signal voltage.

Item 16 includes a bit cell including a pair of cross coupled inverters having a first input/output and a second input/output; a first transistor having a control electrode coupled to a write word line, a first current electrode coupled to a write bit line, and a second current electrode coupled to the first input/output; a source follower having an input coupled to the second input/output and an output; and a second transistor having a first current electrode coupled to the output of the source follower, a control electrode coupled to a read word line, and a second current electrode coupled to the read bit line. Item 17 includes the bit cell of item 16, wherein the source follower comprises a third transistor having a first current electrode coupled to a reference voltage, a gate as the input of the source follower, and a second current electrode as the output of the source follower. Item 18 includes the bit cell of item 17, wherein the pair of cross coupled inverters are powered by a power supply voltage during a read of the bit cell and the power supply voltage is greater than the reference voltage. Item 19 includes the bit cell of item 18, wherein an output voltage at the output of the source follower is limited by the reference voltage when a logic high is applied to the input of the source follower. Item 20 includes the bit cell of item 16, wherein the pair of cross coupled inverters are powered by a power supply voltage during a read of the bit cell, wherein the source follower comprises a third transistor having a first current electrode coupled to power supply voltage, a gate as the input of the source follower, and a second current electrode as the output of the source follower.

What is claimed is:

1. A static random access memory having bit cells connected to different paths for reading than for writing, comprising:
 a first plurality of bit cells in a first row coupled to a true read bit line and a true write bit line;
 a first bit cell of the plurality of bit cells coupled to a first read word line and a first write word line and is selected for reading when the first read word line is enabled, wherein the first bit cell provides a high impedance to the true read bit line when the first bit cell is outputting a first logic state and provides a signal voltage on the true read bit line when the first bit cell is outputting a second logic state, wherein the first logic state is different from the second logic state;
 a second plurality of bit cells in a second row coupled to a complementary read bit line and a complementary write bit line, wherein the first plurality of bit cells and the second plurality of bit cells are powered by a voltage applied between a first power supply terminal at a first voltage and a second power supply terminal at a second voltage during a read;

a precharge circuit that precharges, prior to a read, the true read bit line and the complementary read bit line to a precharge voltage intermediate the first voltage and the second voltage, wherein the precharge voltage is less than the signal voltage;

a dummy cell coupled to the true read bit line that draws charge from the true read bit line when any one of the first plurality of bit cells is selected for reading, wherein when the first bit cell is storing the first logic state the dummy cell causes a predisposition in voltage on the true read bit line; and a sense amplifier coupled to the true read bit line and the complementary read bit line that amplifies a difference between a voltage present on the true read bit line and a voltage present on the complementary read bit line during a read.

2. The memory of claim 1, wherein the first bit cell comprises:

a pair of cross coupled inverters having a first input/output and a second input/output;

a first transistor having a control electrode coupled to the first write word line, a first current electrode coupled to the true write bit line, and a second current electrode coupled to the first input/output;

a source follower having an input coupled to the second input/output and an output;

a second transistor having a first current electrode coupled to the output of the source follower, a control electrode coupled to the first read word line, and a second current electrode coupled to the true read bit line.

3. The memory of claim 2, wherein the source follower of the first bit cell comprises a third transistor having a first current electrode coupled to a reference voltage, a gate as the input of the source follower, and a second current electrode as the output of the source follower.

4. The memory of claim 3, wherein the reference voltage is greater than the intermediate voltage and less than the first voltage.

5. The memory of claim 4, wherein the intermediate voltage is halfway between the first voltage and the second voltage.

6. The memory of claim 5, wherein the second voltage is ground.

7. The memory of claim 1, wherein the dummy cell comprises a capacitor.

8. The memory of claim 7, wherein the dummy cell is further characterized by the capacitor being coupled to the true read bit line during a read of the first plurality of memory cells and being discharged after a read of the first plurality of memory cells.

9. The memory of claim 8, further comprising a second dummy cell comprising a second capacitor wherein the second capacitor is coupled to the complementary read bit line during a read of the second plurality of bit cells and being discharged after the read of the second plurality of bit cells.

10. The memory of claim 1, wherein the second voltage is ground and the intermediate voltage is halfway between the first voltage and ground.

* * * * *